United States Patent
Pannek

(10) Patent No.: US 6,746,932 B2
(45) Date of Patent: Jun. 8, 2004

(54) METHOD OF REDUCING THE THICKNESS OF A SILICON SUBSTRATE

(75) Inventor: Thorsten Pannek, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/318,529

(22) Filed: Dec. 13, 2002

(65) Prior Publication Data

US 2003/0199148 A1 Oct. 23, 2003

(30) Foreign Application Priority Data

Dec. 13, 2001 (DE) ......................... 101 61 202

(51) Int. Cl.⁷ ............................... H01L 21/76
(52) U.S. Cl. ................ 438/409; 438/48; 438/459; 438/753; 438/960
(58) Field of Search ............ 438/48, 406, 409, 438/459, 753, 928, 960, 963

(56) References Cited

U.S. PATENT DOCUMENTS 5,453,394 A * 9/1995 Yonehara et al. ........... 438/455
5,536,361 A * 7/1996 Kondo et al. ............... 438/492
5,949,123 A * 9/1999 Le et al. ..................... 257/496
6,103,009 A * 8/2000 Atoji ........................... 117/97
6,277,712 B1 * 8/2001 Kang et al. ................. 438/471

FOREIGN PATENT DOCUMENTS

| DE | 197 52 208 | 6/1999 |
|---|---|---|
| DE | 100 58 009 | 6/2002 |

* cited by examiner

Primary Examiner—T. N. Quach
(74) Attorney, Agent, or Firm—Kenyon & Kenyon

(57) ABSTRACT

A method of reducing the thickness of a silicon substrate made superficially porous in particular in certain areas on one side. A back of the silicon substrate facing a porous front is made porous over the entire area and the produced porous material is subsequently removed in such a way that the remaining thickness of the substrate, at least in the area where the porous material has been removed from the back, corresponds to a predetermined reduced thickness compared to the original thickness of the substrate. The proposed method is particularly suited for the manufacture of a thermally operating sensor on the basis of technology using porous silicon, of a temperature sensor, a mass flow sensor, an air quality sensor, or a gas sensor.

13 Claims, 1 Drawing Sheet

METHOD OF REDUCING THE THICKNESS OF A SILICON SUBSTRATE

FIELD OF THE INVENTION

The present invention relates to a method, and its application, of reducing the thickness of a silicon substrate which has a superficial porosity, in particular in certain areas.

BACKGROUND INFORMATION

As described in German Published Patent Application No. 197 52 208, in micromechanics porous silicon is primarily used as a sacrificial layer in superficial micromechanical processes in order to, for example, produce cavities which are used for thermal isolation of sensor structures being applied thereon. Due to its low thermal conductivity, porous silicon or oxidized porous silicon may also be used for thermal isolation of sensor structures by itself. The removal of the porous silicon or the oxidized porous silicon produced is omitted in this case to increase the stability of the total system. Such a procedure is described, for example, in unpublished German Patent Application 100 58 009.2.

For producing porous silicon, an electrochemical reaction between a hydrofluoric acid electrolyte and silicon is generally used, whereby a spongelike structure is produced in the silicon, e.g., in the surface area of a silicon wafer. For this purpose the silicon wafer is introduced or immersed into the hydrofluoric acid electrolyte, and the surface of the wafer to be made porous is made into the positive pole vis-a-vis the electrolyte.

Doped silicon wafers are particularly well suited for manufacturing porous silicon, the structure variables within the porous silicon, obtained after porosification, being determined by the type and degree of doping. P-doped silicon wafers having different degrees of doping are preferably used.

Porous silicon has the advantage over conventional silicon due to its large inner surface, and therefore has other important chemical and physical characteristics, e.g., a different etching rate, a different thermal conductivity, and a different thermal capacitance. In particular, through porosification of silicon, its reactivity is clearly increased, which makes selective removal of porous silicon possible using high etching rates vis-a-vis bulk silicon, and in addition, other chemical reactions, e.g., its oxidation, within the porous silicon are made possible or are facilitated.

In thermal sensors based on silicon technology, a good thermal isolation of the sensor structures from a silicon substrate situated beneath them is particularly important. If porous silicon or oxidized porous silicon is produced on a surface area of the silicon wafer in such a thermal sensor, e.g., for thermal isolation, then the quality of the thermal isolation is determined not only by the thickness of this thermally insulating layer but also by the thickness and thermal conductivity of the silicon substrate situated beneath it. If the thickness of the thermally insulating porous layer is too low, or the thickness of the silicon substrate is too high, thermal short circuits may occur.

Using a technology on the basis of porous silicon, it was the initial object of the present invention to minimize the layer thickness of the thermally non-insulating substrate and the thickness of the layer situated beneath the porous area without adding additional complex processing steps. In the manufacture of micromechanical structures it is desirable in many cases to reduce the thickness of the relatively thick silicon wafer for packing reasons. Therefore it was the object of the present invention to integrate this additional thickness reduction procedure into one of the processing steps for the manufacture of micromechanical structures and sensor elements.

SUMMARY OF THE INVENTION

The method according to the present invention of reducing the thickness of a silicon substrate which has a superficial porosity, in particular in certain areas, has the advantage over the related art that it is easily integratable into existing manufacturing processes and usual devices for porosification of silicon may be utilized for its implementation.

Therefore, the method according to the present invention does not require investments in plant engineering, nor does it require substantial modifications in existing manufacturing processes; i.e., using the method according to the present invention, the thickness of silicon substrates may be reduced without additional expense, reducing thermal losses due to the thermal conductivity of the silicon substrate in that way, for example.

Implementing the method according to the present invention has the advantage that, compared to commonly used methods of reducing the thickness of silicon substrates, a very short time is important for removing by etching the porous silicon or the oxidized porous silicon produced. In particular, due to the high reactivity of the porous material produced, thick layers may also be removed by etching in only seconds to minutes, depending on thickness and porosity.

It is advantageous in particular if the silicon substrate is converted into porous silicon or porous silicon oxide, in part of the front surface and the entire back surface. As a rule, the front is defined here by having sensor elements or structures, manufactured using surface micromechanics in particular, produced or positioned there.

It is also advantageous if the porosification of the back is performed by polarity reversal of the voltage during the electrochemical process used for producing the area of porous silicon or porous silicon oxide on the front of the silicon substrate. This polarity reversal may take place once, so that front and back are made porous one after the other, or it may take place alternately, i.e., porosification of front and back of the silicon substrate takes place alternately in small steps. The desired thickness of the back layer of porous silicon is easily adjustable in a known manner via the duration and degree of porosification, so that a well-defined thickness of the layer of porous material is removed from the back, resulting in a similarly well-defined reduction in the original thickness of the silicon substrate after the removal from the back of the porous material produced, which is easily pre-adjusted via the back porosification parameters.

It is also advantageous that all conceivable shapes of microstructures for forming sensor elements, in particular thermal sensor elements, may be produced on the front of the silicon substrate, for example via the porous area which is covered there by a cover layer or a passivation layer. The method according to the present invention is therefore suitable for use in the manufacture of all thermally operating sensors on the basis of a technology using porous silicon, in particular in the manufacture of temperature sensors, mass flow sensors, air quality sensors, or gas sensors.

DETAILED DESCRIPTION

Initially, the present invention is directed to the known method and the device described in German Published Patent Application No. 198 03 852 for porosification of a silicon wafer on its front and back.

Figure 1:
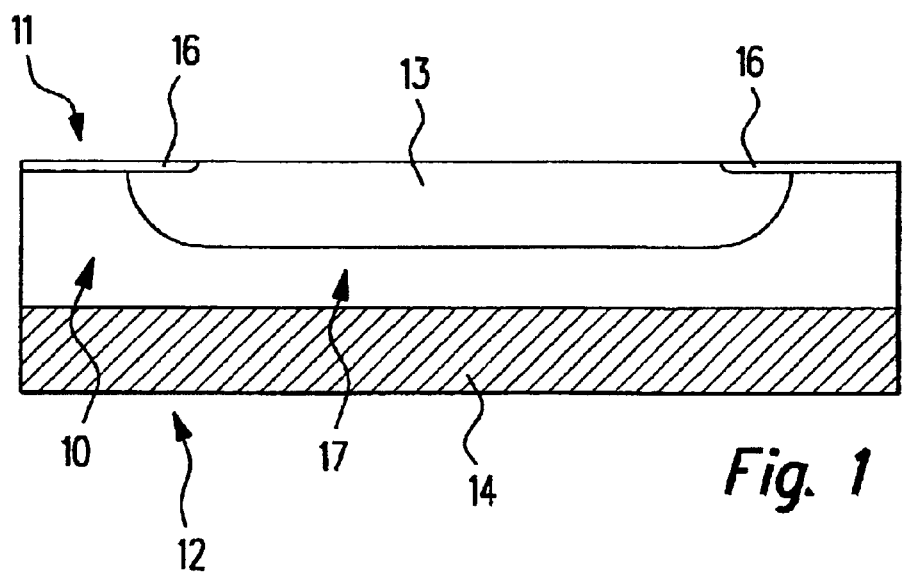
FIG. 1 shows a section through a silicon substrate having a porous area on the front and a porous layer on the back.

FIG. 1 shows a conventional silicon substrate 10, composed of p-doped silicon for example, and masked on its front 11 in certain areas by a masking layer 16.

According to German Published Patent Application No. 198 03 852, this silicon substrate 10 is then introduced into the etching device where front 11 initially serves as an anode vis-a-vis the hydrofluoric acid electrolyte located in the etching device, so that a porous area 13, composed of porous silicon, is produced in the area of front 11 of silicon substrate 10.

Subsequently, polarity reversal of the electric voltage applied during porosification within the scope of the electrochemical process according to German Published Patent Application No. 198 03 852 takes place, so that back 12 of silicon substrate 10 serves as an anode vis-a-vis the hydrofluoric acid electrolyte, resulting in the conversion of back 12 of silicon substrate 10 into porous silicon. Due to the polarity reversal of the electric voltage, porosification of front 111 of silicon substrate 10 stops, at least largely, at the same time.

Since no masking layer 16 is provided on back 12 of silicon substrate 10, back 12 is made porous over the entire area in this example.

In a usual manner, the thickness of porous layer 14, produced on back 12, is determined by the duration of the electrochemical etching, the hydrofluoric acid concentration in the electrolyte, and the current density. A suitable choice of these parameters is described in detail in German Published Patent Application No. 198 03 852, so that their repetition may be omitted.

It should also be noted that the polarity reversal used for electrochemical etching of the silicon substrate in the hydrofluoric acid electrolyte in a device according to German Published Patent Application No. 198 03 852 in which front 111 and back 12 are in contact with the hydrofluoric acid electrolyte, may take place either once or several times. In the latter case, porous area 13 on front 11 and porous layer 14 on back 12 of silicon substrate 10 are gradually produced in small steps. Furthermore it is important that a residual area 17, composed of silicon and not made porous, always remains between porous area 13 and porous layer 14, facing one another, and, for stability reasons, has a thickness of at least 10 μm.

After front 11 and back 12 of silicon substrate 10 have been made porous, as explained with the help of FIG. 1, the porous silicon produced may optionally be stabilized by subsequent oxidation, i.e., transformed into oxidized porous silicon.

Figure 2:
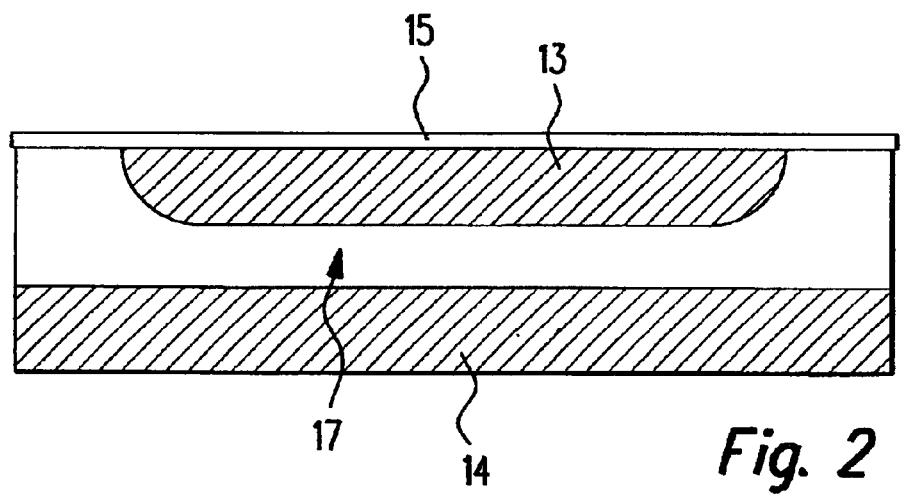
FIG. 2 in continuation of FIG. 1 shows an additionally applied cover layer.

In continuation of FIG. 1, FIG. 2 explains how porous area 13 on front 11 of silicon substrate 10 is covered by a usual cover layer or passivation layer 15. Cover layer 15 is a silicon nitride layer which has been deposited using a CVD method ("chemical vapor deposition").

Figure 3:
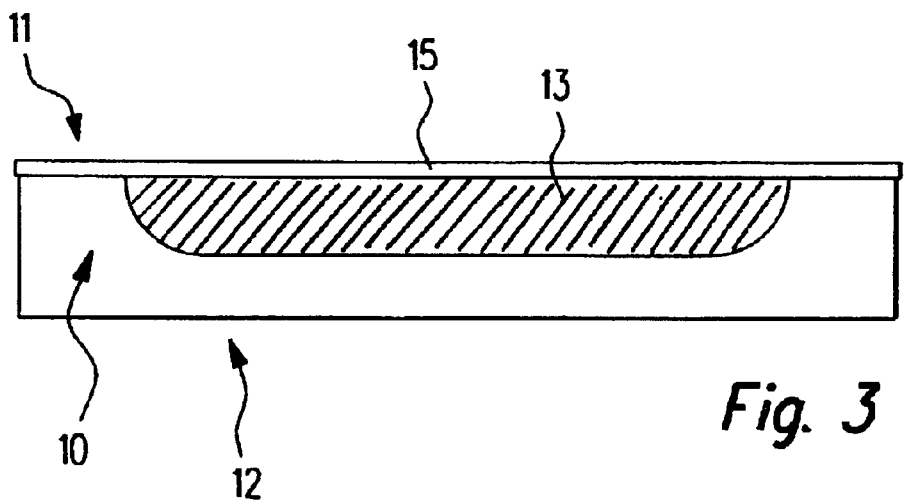
FIG. 3 in continuation of FIG. 2, shows the silicon substrate whose thickness has been reduced by removal of the porous layer on the back.

Based on FIG. 2, FIG. 3 finally shows how porous layer 14 on back 12 of silicon substrate 10 is removed in order to reduce the thickness of silicon substrate 10 to a predetermined desired thickness. It is obvious here that the extent of the reduction of the thickness of silicon substrate 10 results directly from the thickness of porous layer 14 which has been removed.

According to FIG. 3, the removal of porous layer 14, composed of either porous silicon or oxidized porous silicon, from the entire back area, takes place either by etching of the porous silicon in a KOH solution, or by etching of the produced porous silicon oxide in a hydrofluoric acid solution. Due to a clearly reduced etching rate when etching using the KOH solution or the HF solution, an extreme slow-down in the etching process, or even a complete etching stop, takes place in the transition area of porous layer 14 to silicon substrate 10, so that the areas of silicon substrate 10, not made porous, are not significantly attacked. During removal of porous layer 14 from the back, front 11 of silicon substrate 10 is also not attacked due to passivation layer or cover layer 15.

What is claimed is:

1. A method of reducing a thickness of a silicon substrate, comprising:

in order to produce porous material, making a back of the silicon substrate facing a porous front porous over an entire area thereof, and subsequently removing the produced porous material such that a remaining thickness of the silicon substrate, at least in an area where the porous material has been removed from the back, corresponds to a predetermined reduced thickness compared to an original thickness of the silicon substrate.

2. The method as recited in claim 1, wherein:

the silicon substrate is made superficially porous in an area on a side thereof.

3. The method as recited in claim 1, further comprising:

converting the silicon substrate into one of porous silicon and porous silicon oxide one of in an area on the front and over an entire area on the back.

4. The method as recited in claim 1, wherein:

the front and the back are made porous one of consecutively and alternately.

5. The method as recited in claim 4, wherein:

alternation between porosification of the front and porosification of the back takes place via a polarity reversal of an electric voltage applied during porosification within an electrochemical process.

6. The method as recited in claim 1, wherein:

porosification of the front in a certain area and porosification of the back over the entire area takes place in such a way that an area of silicon having a thickness of at least 10 μm always remains between two porous areas facing one another.

7. The method as recited in claim 1, wherein:

porous silicon, produced on at least one of the front and on the back, is converted into oxidized porous silicon.

8. The method as recited in claim 1, further comprising:

prior to a removal of one of the porous material and an area produced on the back, covering a porous area produced on the front by one of a cover layer and passivation layer.

9. The method as recited in claim 8, wherein:

the one of the cover layer and the passivation layer includes a silicon nitride layer.

10. The method as recited in claim 1, further comprising:
masking the front in certain areas using a masking layer.

11. The method as recited in claim 1, wherein:
the masking layer includes a silicon nitride layer.

12. The method as recited in claim 1, further comprising:
removing the porous material produced on the back by etching using one of a KOH solution and a hydrofluoric acid solution.

13. The method as recited in claim 1, wherein:
the method is used to manufacture one of a thermally operating sensor on the basis of technology using porous silicon, a temperature sensor, a mass flow sensor, an air quality sensor, and a gas sensor.

\* \* \* \* \*